United States Patent [19]

Nagel

[11] Patent Number: 4,951,057
[45] Date of Patent: Aug. 21, 1990

[54] INDUCTIVE INPUT/OUTPUT COUPLING FOR A SURFACE ACOUSTIC WAVE DEVICE

[75] Inventor: Jon L. Nagel, Cupertino, Calif.

[73] Assignee: X-Cyte, Inc., Mountain View, Calif.

[21] Appl. No.: 434,234

[22] Filed: Nov. 13, 1989

[51] Int. Cl.⁵ ............................................. G01S 13/80
[52] U.S. Cl. .......................................... 342/51; 342/44
[58] Field of Search .............................. 342/51, 44, 42

[56] References Cited

U.S. PATENT DOCUMENTS

| | | | |
|---|---|---|---|
| 4,604,623 | 8/1986 | Skeie . | |
| 4,605,929 | 8/1986 | Skeie . | |
| 4,623,890 | 11/1986 | Nysen | 342/44 |
| 4,625,207 | 11/1986 | Skeie | 342/51 |
| 4,625,208 | 11/1986 | Skeie et al. | 342/51 |
| 4,663,625 | 5/1987 | Yewen | 340/825.54 |
| 4,703,327 | 10/1987 | Rossetti et al. | 342/44 |
| 4,725,841 | 2/1988 | Nysen et al. | 342/44 |
| 4,734,698 | 3/1988 | Nysen et al. | 342/44 |
| 4,737,789 | 4/1988 | Nysen | 342/51 |
| 4,737,790 | 4/1988 | Skeie et al. | 342/51 |
| 4,745,401 | 5/1988 | Monteau | 340/572 |

Primary Examiner—Thomas H. Tarcza
Assistant Examiner—John B. Sotomayor
Attorney, Agent, or Firm—Milde & Robinson

[57] ABSTRACT

A transponder for use in an interrogator/transponder system includes a piezoelectric substrate for coupling electrical energy into and/or out of a surface acoustic wave (SAW) device; a first inductive loop inductively coupled to a conductive loop on the substrate, a second inductive loop inductively coupled to the first inductive loop for transmitting and/or receiving electrical signals to and/or from the SAW device. The first inductive loop forms an intermediate inductive coupling path between the second inductive loop of the transmitter/-receiver and the conductive loop on the substrate.

19 Claims, 6 Drawing Sheets

INDUCTIVE INPUT/OUTPUT COUPLING FOR A SURFACE ACOUSTIC WAVE DEVICE

BACKGROUND OF THE INVENTION

The present invention relates to apparatus for coupling electrical energy into and/or out of a surface acoustic wave ("SAW") device. More particularly, the present invention relates to apparatus for coupling energy into and out of a SAW device which serves as a transponder in a "passive interrogator label system".

A "passive interrogator label system", so-called, is a radar system utilizing transponders which are capable of receiving an interrogating first signal, processing this signal and transmitting a second signal, in reply, that is derived from the first signal and contains encoded information. Because the encoded information normally includes an identification code that is unique to each transponder, and because the transponders of such a system are relatively light weight and small and may be easily attached to other objects to be identified, these transponders are sometimes referred to as "labels". Furthermore, the transponders, which may be implemented by SAW devices, carry no self-contained power source, such as a battery, that must be periodically replaced. Consequently, these transponders are denominated as being "passive"; hence the name "passive interrogator label system".

Passive interrogator label systems of the type to which the present invention relates are disclosed, for example, in the following U.S. patents:

U.S. Pat. No. 4,737,789 of Paul A. Nysen for "Inductive Antenna Coupling for a Surface Acoustic Wave Transponder";

U.S. Pat. No. 4,703,327 of Anthony J. Rossetti and Paul A. Nysen for "Interrogator/Receiver System for Use With a Remote Transponder"; and U.S. Pat. No. 4,737,790 of Halvor Skeie and Donald Armstrong for "Passive Interrogator Label System with a Surface Acoustic Wave Transponder Operating at its Third Harmonic and Having Increased Bandwidth".

In general, a passive interrogator label system includes an "interrogator" for transmitting a first radio frequency signal; at least one passive transponder which receives this first signal, processes it, and sends back a second radio frequency signal containing encoded information; and a receiver, normally located next to the interrogator, for receiving the second signal and decoding the transponder encoded information.

The passive transponder, as disclosed in these patents, comprises a SAW device and a dipole antenna, either electrically or inductively coupled to the SAW transducers on the SAW device. The dipole antenna is formed by printing conductive ink (e.g. silver) on a substrate in the prescribed antenna pattern, or by stamping a metal foil into the size and shape of the antenna pattern and bonding this foil by heat and pressure to the substrate (e.g. a polyethyline coated Mylar sheet). The antenna with its substrate are therefore relatively flat and, depending upon the radio frequency of operation, is relatively modest in size.

For example, the antenna characteristics required for this application, operating at a frequency of approximately 915 MHz., determine that the antenna be physically approximately one inch wide and three inches long. The SAW device, to which the antenna is coupled, is also placed on the substrate to form the complete assembly or "label".

This flat, card-like structure is ideal for many applications such as identification badges for personnel and ID tags for automobiles, factory parts or the like.

The aforementioned U.S. Pat. No. 4,737,789 describes means for inductively coupling a SAW transponder to an antenna by means of an inductive loop formed by at least one turn of an electrical conductor and having an inductance which is substantially equal to the capacitance presented at the terminals of the SAW device within the frequency range of operation. The two free ends of the loop are electrically connected to the two transducer terminals of the SAW device so that the loop and the device form a resonant circuit at the frequency range of operation.

The U.S. Pat. No. 4,737,789 also describes a package comprising a substrate formed by a Mylar sheet coated on both sides with a polyethyline based, thermally activated adhesive; a SAW device comprising a lithium niobate piezoelectric substrate and a partial turn of a metal foil inductive loop, bonded to the Mylar substrate and electrically connected to the two terminals of the SAW device. This entire assembly is then encapsulated and placed next to an inductive loop which is electrically connected to, or formed integrally with, the antenna.

While the SAW device and its associated inductive loop, so connected, may be conveniently packaged together in a glass or ceramic envelope to form a separate manufactured unit, which may be then mounted adjacent an antenna structure, this package assembly necessarily requires several manufacturing steps to produce. This package is also relatively thick in its final form. Whereas the physical size of the assembly is not significant in many applications, certain applications, such as wallet size ID tags or cards, require the assembly to be as thin as possible.

The commonly-owned U.S. Pat. Application No. 07/434,232 of Paul A. Nysen, Jon L. Nagel, and Richard D. Smith entitled "Inductively Coupled SAW Device and Method of Making the Same", filed concurrently herewith, discloses a SAW device having a conductive loop deposited on the active surface of the piezoelectric substrate which is electrically connected at its ends to the two transducer terminals of the device. The conductive loop forms an inductive element for coupling energy into and out of the SAW device. The active surface containing the acoustic paths of the SAW device is protected by a nonconductive cover disposed above, and attached to, the surface by means of an adhesive. This cover may be made of glass, for example.

This device, comprising the SAW substrate with the inductive loop pattern and its associated cover is preferably placed in a protective frame which laterally surrounds the SAW substrate and cover. The protective frame, which may be made of metal to provide resilience and strength, may have the same thickness as the combined thickness of the substrate and cover. This entire package, including the substrate, cover and frame is therefore extremely small in its dimensions and yet mechanically strong and completely passivated and protected against outside elements.

The reduction in size of the SAW device package brought about by placing the inductive loop on the SAW substrate itself creates a problem of alignment and registration with the corresponding inductive loop associated with the antenna. Significant loss of signal results when the SAW device, with its inductive loop, is not precisely aligned and packaged with the inductive loop of the antenna.

SUMMARY OF THE INVENTION

It is a principal object of the present invention to provide a SAW device which is inductively coupled to a signal source or sink, such as an antenna, but which does not require precise registration between the inductive coupling loop of the SAW device and the inductive coupling loop of the signal source or sink.

This object, as well as other objects which will become apparent from the discussion that follows, are achieved, in accordance with the present invention, by providing an additional, intermediate inductive loop, formed by at least a partial turn of an electrical conductor, which is inductively coupled to both the inductive loop on the SAW substrate and the inductive loop associated with the signal source or sink. This additional, intermediate inductive loop is preferably placed on the protective frame surrounding the SAW device so as to provide a substantially larger region of influence than the inductive loop on the SAW substrate. Because of this larger region of influence, the alignment and registration between the intermediate inductive loop and the inductive loop associated with the antenna is no longer critical.

For a full understanding of the present invention, reference should now be made to the following detailed description of the preferred embodiments thereof, taken in conjunction with the accompanying drawings.

DESCRIPTION OF THE PREFERRED EMBODIMENTS

The preferred embodiments of the present invention will now be described with reference to FIGS. 1–17 of the drawings.

Figure 1:
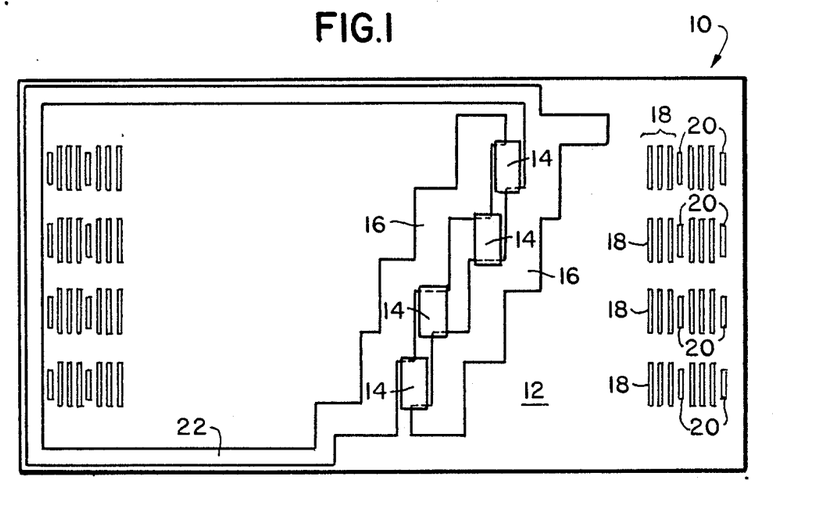
FIG. 1 is a top view of a SAW substrate surface comprising a multitude of transducers, a conductive loop which serves as a coupling element and a multitude of reflectors positioned in the SAW paths defined by the transducers.

FIGS. 1–4 illustrate a packaged SAW device containing an onboard conductive loop which serves to inductively couple energy into and out of the device. As shown in FIG. 1, the device 10 comprises a piezoelectric substrate 12, preferably of lithium niobate, on which are deposited a plurality of SAW transducers 14 connected in paralled by means of bus bars 16. The transducers 14 produce surface acoustic waves along eight separate surface acoustic wave paths. The SAW waves pass beneath the delay pads 18 and are reflected back to the transducers 14 by reflectors 20. The structure and operation of this SAW device is fully described in the aforementioned U.S. Pats. Nos. 4,703,327 and 4,737,790.

Connected to the two bus bars 16 is a U-shaped conductive layer 22 which serves as an inductor to couple inductive energy into and out of the SAW device.

Figure 2:
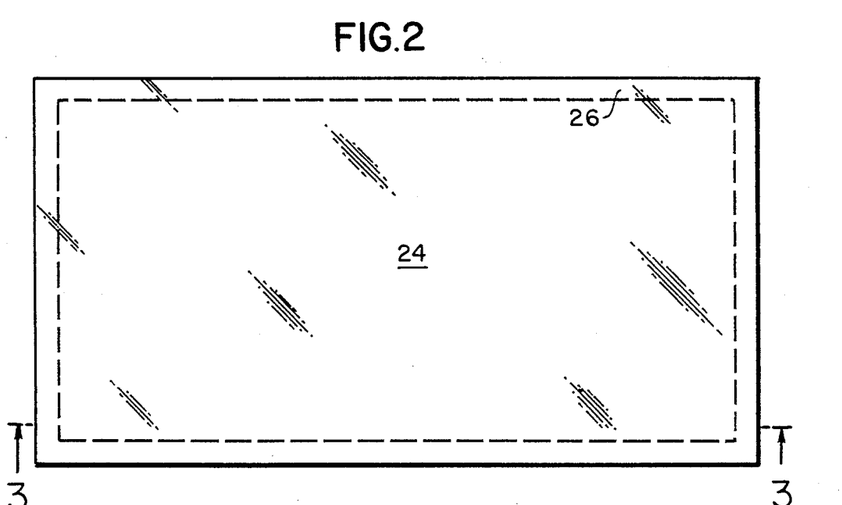
FIG. 2 is a top view of a non-conductive cover for the substrate of FIG. 1.

FIG. 2 shows, in top view, a glass cover 24 for the SAW device of FIG. 1. The cover is attached to the rim of the substrate 12 by means of an adhesive layer 26. The adhesive is permitted to contact the U-shaped conductive layer 22 but cannot cover the region of the surface acoustic wave paths.

Figure 3:
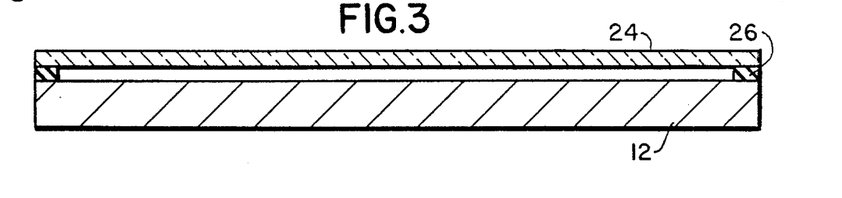
FIG. 3 is a cross-sectional view of the non-conductive cover of FIG. 2 disposed on the SAW substrate of FIG. 1.

FIG. 3 shows, in cross-section, the SAW substrate 12, adhesive layer 26 and the glass cover 24. The thickness of these respective layers is preferably 0.020, 0.003, and 0.006 inches, respectively.

Figure 4:
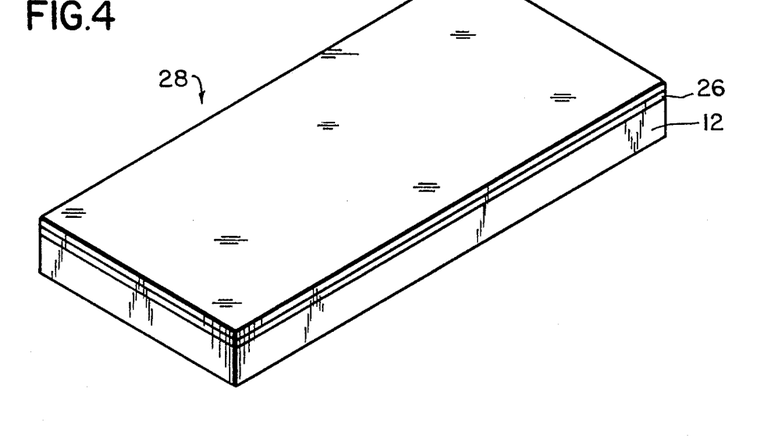
FIG. 4 is a perspective view of the SAW substrate of FIG. 1 and the cover of FIG. 2, assembled together to form a SAW device as shown in FIG. 3.

FIG. 4 shows the SAW device assembly in perspective view. It will be understood that this assembly is extremely small. Preferably, it is 0.173 inches wide and 0.324 inches long.

Figure 5A:
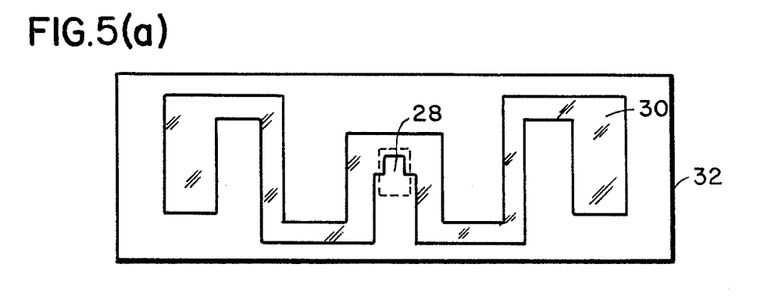
FIG. 5(a) is a top view of the SAW device of FIG. 4 arranged in registration with an inductive loop of a dipole antenna.
Figure 5B:
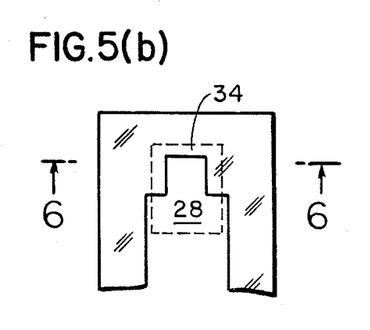
FIG. 5(b) is a top view of a highlighted portion of FIG. 5(a) displaying the SAW device and the antenna inductive loop in further detail.
Figure 6:
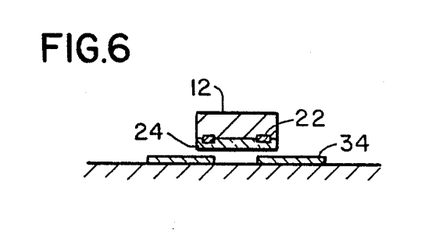
FIG. 6 is a cross-sectional view taken along the line 6—6 of FIG. 5(b) showing the registration of inductive loops.

FIGS. 5a, 5b and FIG. 6 illustrate how the SAW device assembly of FIG. 4 must be placed in registration with an inductive loop on an antenna to couple energy between the antenna and the SAW device. As shown in FIG. 5a, the SAW device 28 is placed at the center of a dipole antenna 30 formed of metal foil or conductive ink. This antenna is disposed on a flat substrate 32 which may, for example, comprise polyethyline coated Mylar.

As shown in FIG. 5b, the SAW device 28 is placed in registration with a corresponding loop area 34 on the antenna to provide the inductive coupling between the antenna and the conductive loop 22 on the device. FIG. 6 illustrates how the saw device 28 is aligned to precisely register the conductive loop 22 with the inductive loop portion 24 of the antenna 30.

This requirement for a precise registration presents difficult manufacturing problems, particularly, since the "label" formed by the SAW device and antenna must be mass produced.

According to the present invention, this problem of registration is alleviated by providing an intermediate inductive loop between the conductive loop 22 and the antenna loop 34 to serve as an intermediate inductive coupling path.

According to the preferred embodiment and best mode of practicing the present invention, this intermediate loop may be implemented in the manner shown in FIGS. 7-10. As is illustrated there, the SAW device 28, or more particularly the SAW device assembly as shown in FIGS. 1-4, is placed in a rigid frame 36 which provides mechanical support against bending and protects the edges of the device 28 against chipping. This frame may be made of any structurally rigid material. A particularly advantageous material is stainless steal, since such material can be stamped from a sheet into the proper shape.

Figure 7:
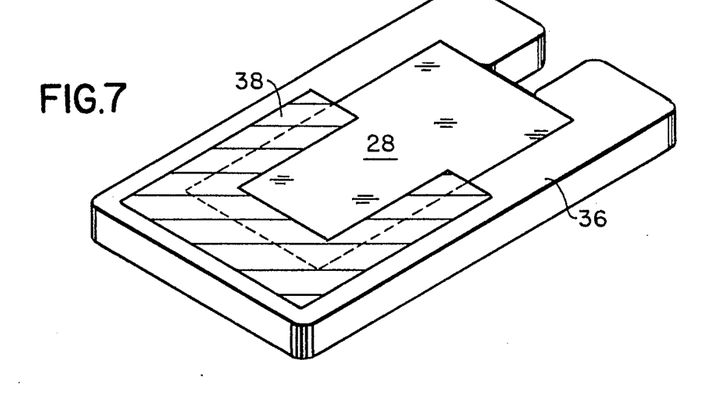
FIG. 7 is a perspective view of a SAW device arranged in a protective frame.

Preferably, the protective frame has approximately the same thickness as the SAW device 28, which is about 0.021 inches.

Figure 8:
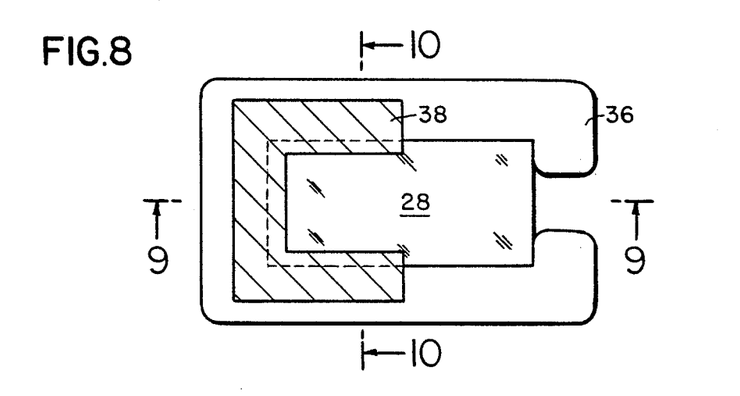
FIG. 8 is a top view of the SAW device and protective frame of FIG. 7.
Figure 9:
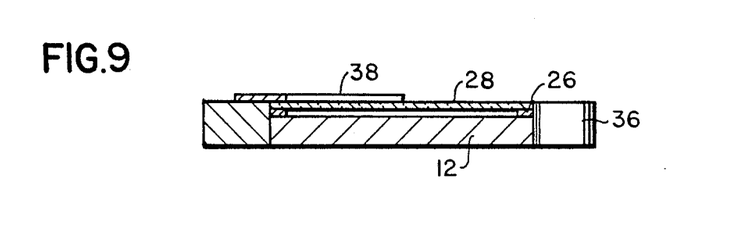
FIG. 9 is a cross-sectional view taken along the line 9—9 of FIG. 8.

According to the invention, a conductive layer 38 is superimposed over the SAW device 28 and the supporting frame 36. This layer 38 may, for example, be of metal foil or conductive ink such as silver ink. The conductive ink may be placed down by screen printing or some other well known technique.

Figure 10:
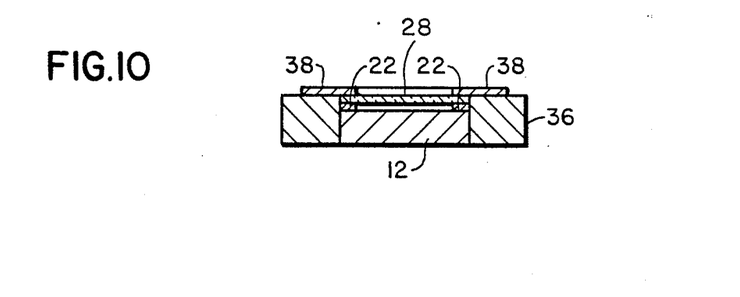
FIG. 10 is a cross-sectional view taken along the line 10—10 of FIG. 8.

As is shown in FIG. 10, which is a cross-sectional view taken along the line 10—10 in FIG. 8, the conductive layer 38 is disposed in a plane which is parallel to the plane of the conductive loop 22 on the SAW substrate 12. The layer 38 is arranged immediately above the conductive loop 22 to provide inductive coupling.

Figure 11:
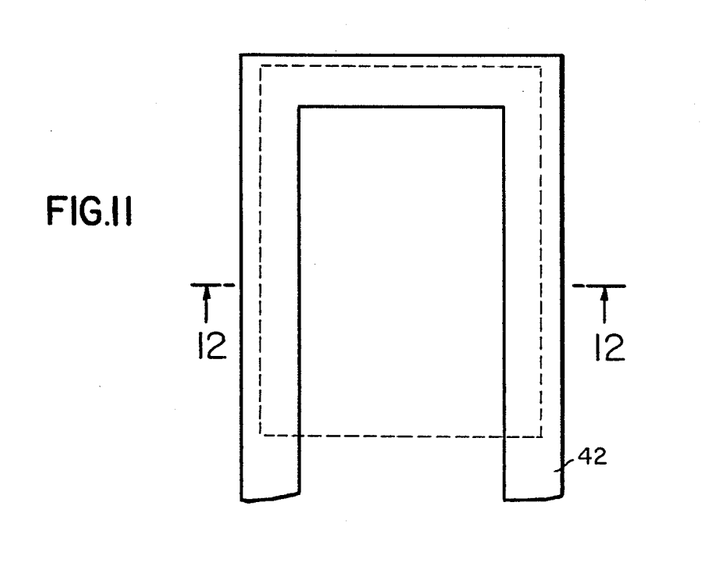
FIG. 11 is a top view of the SAW device and protective frame of FIG. 7 arranged on an inductive loop of an antenna.
Figure 12:
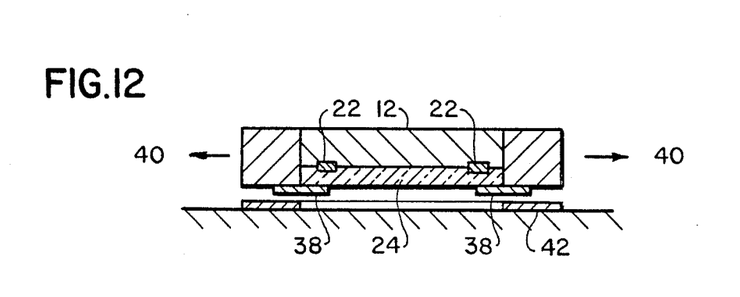
FIG. 12 is a cross-sectional view taken along the line 12—12 of FIG. 11.

FIGS. 11 and 12 illustrate how the SAW device 28, with its surrounding frame 36, may be placed on an antenna loop to provide inductive coupling between the antenna loop and the SAW device. As is particularly apparent on the cross sectional view of FIG. 12, the aforementioned problem of registration is alleviated since the conductive layer 38 may be made much wider than the conductive loop 22 on the SAW substrate 12. Consequently, the SAW device 28 with its supporting frame 36 may be moved laterally in the direction of the arrows 40 without impairing the coupling between the antenna and the SAW device. The antenna loop formed by the conductive layer 42 may be in direct electrical contact with the intermediate loop 38; however, such electrical contact is not required since the intermediate loop 38 interacts inductively with the loop 42.

Figure 13:
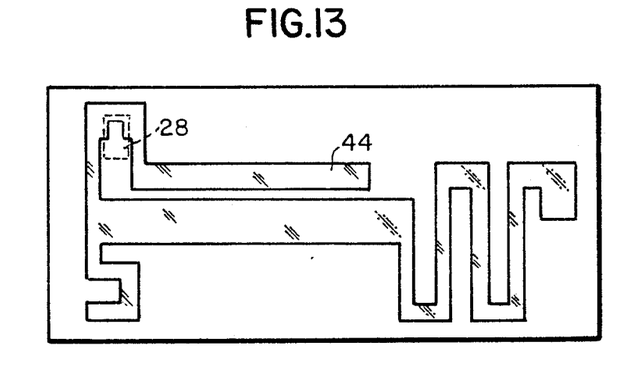
FIG. 13 is a top view of a SAW device without an intermediate loop according to the present invention and an antenna with an inductive loop, all arranged on a substrate.

FIGS. 13 and 1 clearly illustrate how the registration problem presented by the on-chip conductive loop is alleviated by the present invention. FIG. 13 shows a SAW device 28, without an intermediate inductive loop, disposed on an antenna 44. In this case the SAW device must be precisely aligned in the manner illustrated in FIG. 5(b) with the inductive loop of the antenna.

Figure 14:
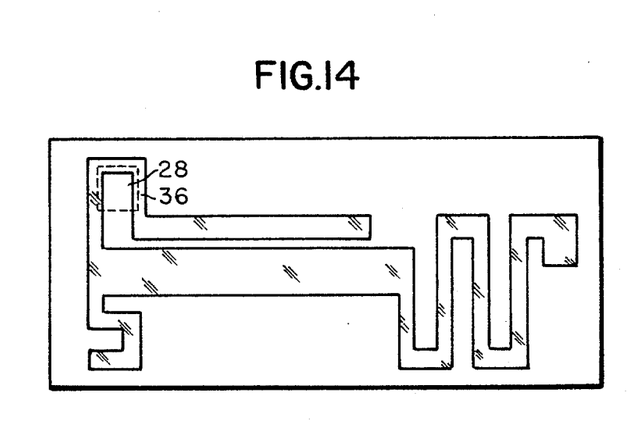
FIG. 14 is a top view of a SAW device with an intermediate loop according to the present invention and an antenna with an inductive loop, all arranged on a substrate.

As illustrated in FIG. 14, the inductive loop of the antenna may be made larger and the SAW device 28 with its surrounding frame 36 and intermediate loop 38 may be placed with greater tolerance over this loop.

Figure 15:
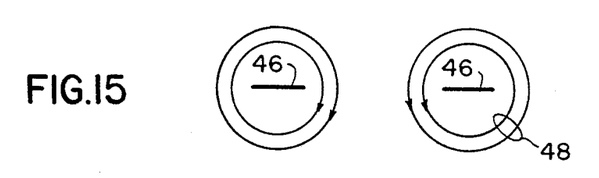
FIG. 15 is a representational diagram showing the magnetic fields generated by a flat inductive loop.
Figure 16:
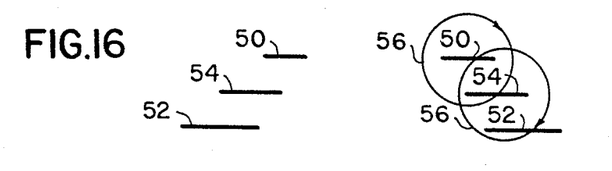
FIG. 16 is a representational diagram showing three flat inductive loops arranged on separate parallel planes.
Figure 17:
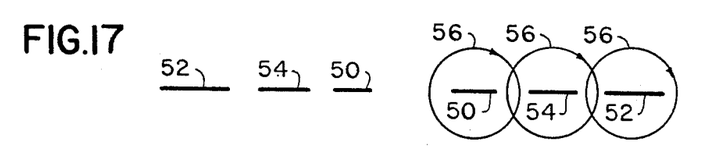
FIG. 17 is a representational diagram showing three flat inductive loops arranged on a common plane.

The principle of operation of the present invention is illustrated in FIGS. 15-17. FIG. 15 shows a single inductive loop 46 in cross section. This loop is formed, in the manner described above, by a layer of foil or a conductive ink on a suitable substrate. When a current is passed through the loop 46 it generates a magnetic field 48 in accordance with the well known right hand rule. Although this field is reresented by circles in the figure, it will, of course, have a flattened shape due to the flattened shape of the conductive loop.

FIGS. 16 and 17 illustrate how energy may be coupled back and forth between inductive loops 50 and 52 through an intermediate loop 54. In FIG. 16, the three loops are each arranged in separate, parallel planes. In FIG. 17, the three loops are arranged on a common plane. The inductive coupling between the loops 50 and 52 via the intermediate loop 54 is represented by the circles 56.

There has thus been shown and described a novel inductive input/output coupling for a SAW device which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention which is limited only by the claims which follow.

What is claimed is:

1. Apparatus for coupling electrical energy into and/or out of a surface acoustic wave (SAW) device, such as a transponder, said SAW device having a piezoelectric substrate with an exposed surface; at least one SAW transducer, disposed on said substrate surface, for converting between electrical energy and SAW energy; and a conductive loop disposed on said substrate surface and electrically connected with said transducer, said conductive loop forming an inductive element for coupling energy into and/or out of said SAW device; said apparatus comprising, in combination:
   (a) a first inductive loop formed by at least a partial turn of an electrical conductor, said first inductive loop being inductively coupled to said conductive loop on said substrate surface; and
   (b) means for transmitting and/or receiving an electrical signal to and/or from said SAW device, said means having a second inductive loop which is inductively coupled to said first inductive loop,
   whereby said first inductive loop forms an intermediate inductive coupling path between said second inductive loop of said transmitting/receiving means and said conductive loop on said substrate surface.

2. The apparatus defined in claim 1, wherein said antenna comprises a planar conductive layer arranged on a substrate, said conductive layer forming said second inductive loop as an integral part thereof.

3. The apparatus defined in claim 1, wherein said first and second inductive loops are co-planar.

4. The apparatus defined in claim 1, wherein said first and second inductive loops are co-planar with said conductive loop on said substrate surface.

5. The apparatus defined in claim 1, wherein said first inductive loop and said second inductive loop are arranged in separate, parallel planes.

6. The apparatus defined in claim 5, wherein said conductive loop on said substrate surface, said first inductive loop and said second inductive loop are each arranged in separate, parallel planes.

7. The apparatus defined in claim 1, further comprising a planar frame member, attached to said substrate and at least partially surrounding said substrate, for providing mechanical support to said substrate.

8. The apparatus defined in claim 7, further comprising a non-conductive cover disposed above said substrate surface for. preventing foreign objects from contacting said surface.

9. The apparatus defined in claim 8, wherein said frame member surrounds both said substrate and said non-conductive cover, said frame member having a thickness substantially equal to the combined thickness of said substrate and said non-conductive cover.

10. The apparatus defined in claim 7, wherein said frame member is made of stainless steel.

11. The apparatus defined in claim 7, wherein said frame member is joined to said substrate by means of an adhesive.

12. The apparatus defined in claim 7, wherein said first inductive loop comprises a conductive layer on said frame.

13. The apparatus defined in claim 8, wherein said first inductive loop comprises a conductive layer on said frame and said cover.

14. The apparatus defined in claim 12, wherein said conductive layer is formed of conductive ink.

15. The apparatus defined in claim 13, wherein said conductive layer is formed of conductive ink.

16. The apparatus defined in claim 14, wherein said conductive ink includes silver.

17. The apparatus defined in claim 15, wherein said conductive ink includes silver.

18. The apparatus defined in claim 1, wherein said transmitting/receiving means includes an RF antenna.

19. The apparatus defined in claim 1, wherein said antenna and said second inductive loop are integrally formed as a planar conductive layer on a planar substrate.

* * * * *